United States Patent [19]

Shevlin

[11] Patent Number: 5,234,769
[45] Date of Patent: Aug. 10, 1993

[54] WEAR RESISTANT TRANSPARENT DIELECTRIC COATINGS

[75] Inventor: Craig Shevlin, Rohnert Park, Calif.

[73] Assignee: Deposition Sciences, Inc., Santa Rosa, Calif.

[21] Appl. No.: 869,621

[22] Filed: Apr. 16, 1992

[51] Int. Cl.⁵ ............................ B23B 9/00
[52] U.S. Cl. ..................... 428/409; 428/901; 428/210; 428/432; 174/250; 174/255; 174/256; 174/258
[58] Field of Search ............. 428/901, 432, 409; 174/250, 255, 256, 258, 210

[56] References Cited

U.S. PATENT DOCUMENTS 3,074,816  1/1963  Blazek ............... 174/256
3,844,831 10/1974  Cass et al. .......... 174/256

Primary Examiner—Patrick J. Ryan
Assistant Examiner—Cathy Lee
Attorney, Agent, or Firm—Malcolm B. Wittenberg

[57] ABSTRACT

A substantially transparent wear resistant member wherein a dielectric layer is coated on a support such as glass. Wear resistance is enhanced by reducing fine-scale surface roughness of the dielectric layer.

11 Claims, 1 Drawing Sheet

WEAR RESISTANT TRANSPARENT DIELECTRIC COATINGS

TECHNICAL FIELD OF THE INVENTION

The invention relates to transparent dielectric coatings with excellent mechanical durability and wear resistance, and the methods and procedures for producing such coatings. A key element of the invention is the recognition that the surface roughness of transparent dielectric coatings is of critical importance in determining the mechanical durability of such coatings. The control and modification of surface roughness is essential in applications involving severe damage environments, such as point-of-sale scanner windows.

BACKGROUND OF THE INVENTION

Point-of-sale scanner windows, lenses, mirrors, viewing screens, transparent counter tops, and certain infrared devices, are some examples of the many applications in which a hard, transparent surface coating of good optical clarity is required as a protective layer for glass or other transparent material in order to protect them from mechanical damage due to wear, impact, scratching and the like. Such protective coatings must protect the underlying substrate material from damage, and be resistant to damage themselves. Damage may be defined as any scratch, mark or defect which causes any decrease in clarity of the coating through the scattering, deviation, or dispersion of light that would normally pass through undeflected. Transparent dielectric materials are those which are transparent in some portion of the electromagnetic spectrum, from 0.2 microns to 30 microns in wavelength.

Transparent dielectric coatings such as aluminum oxide, aluminum nitride, silicon nitride and others well known to workers in the field, are commonly used as mechanically durable transparent protective overcoats for softer materials such as glass and plastic, among others. In order for these and other hard protective coatings to function they must be sufficiently thick to resist cracking brought about by the elastic deflection of the softer underlying substrate material during a damage event such as a scratch or impact. While the coating thickness required to resist cracking due to substrate deflection i0 will depend upon the coating and substrate materials as well as the severity of the damage environment, it is generally held that such protective coatings must be greater than 0.5 micron in thickness, and may, in severe damage environments, be as thick as 100 microns.

The coatings required for transparent protective overcoats may be deposited by any of a number of deposition techniques, such as evaporation, sputtering, chemical vapor deposition, dip coating or others well known to workers in the field. Regardless of the method of growth or deposition of the coating it is found that the surface roughness of these coatings tends to increase with the thickness of the coating.

The surface roughness of these coatings is a consequence of the growth characteristics during deposition. In the initial stages of deposition, coatings tend to form as numerous separate islands on the substrate. As more coating material arrives at the substrate these islands grow laterally until they impinge upon one another. Once the entire surface is covered with an island structure the islands begin to grow in height, becoming columns. As the coating continues to grow in thickness all of the columns do not grow in height at exactly the same rate due to differences in column diameters and atomic arrangement within columns. These differences in column growth rates thus create a surface roughness which increases in magnitude with coating thickness.

There are other factors which contribute to surface roughness in coatings. So called growth nodules are formed when minute particles of dust or other particulate matter are incorporated into the coating during growth creating a surface bump or protrusion. Similarly, any roughness in the underlying substrate surface will tend to be replicated by the coating to produce a surface irregularity.

For very thin coatings, less than approximately 0.5 microns in thickness, growth nodules and substrate roughness are the main contributors to coating roughness. As coating thickness increases, the contribution to surface roughness caused by nodules and substrate roughness decreases while that due to columnar growth increases.

SUMMARY OF THE INVENTION

The present invention deals with a substantially transparent wear resistant member. The wear resistant member comprises a substantially transparent support having one or more layers of substantially transparent dielectrics coated thereon. The dielectric layer(s) exhibits an average surface roughness not exceeding 100 Å rms.

DETAILED DESCRIPTION OF THE INVENTION

Figure 1:
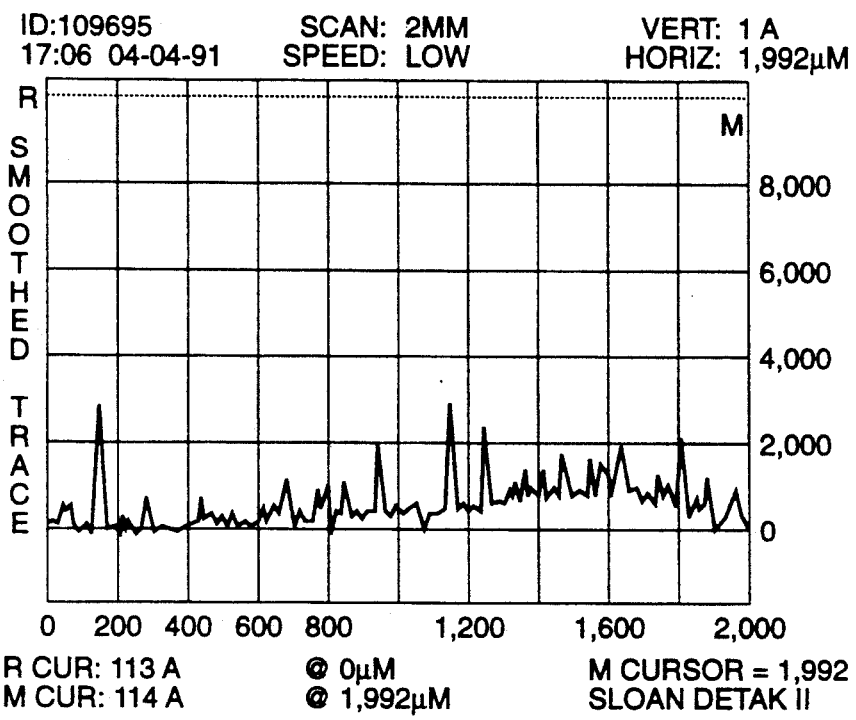

It is now recognized that the fine-scale surface roughness in thin, transparent dielectric coatings is of primary importance in determining the mechanical durability and wear resistance of such coatings. This has not previously been known and it has been assumed that thin, transparent dielectric coatings (i.e., 0.5 microns-10 microns in thickness) have very smooth surfaces when coated on a very smooth surface such as, for example, float glass. While such coatings may appear to be very smooth, they are in reality insufficiently smooth to resist mechanical damage in severe damage environments. In such an environment, where severe sliding wear, impact and scratching are important considerations, surface roughness and irregularities in the form of fine-scale bumps or protrusions in the surface of an apparently smooth coating interact with articles making contact with the coated surface to produce sites of mechanical damage.

The very fine-scale protrusions or peaks in an apparently smooth coated surface are thus regions which are very easy to damage compared to the much smoother coatings described herein.

In a wear environment where articles slide across the surface of the transparent dielectric coating, the damage mechanism may be abrasive and/or adhesive. In abrasive wear the contacting article acts to remove the peaks of the surface roughness protrusions through mechanical ploughing. In adhesive wear the contacting article becomes momentarily coupled or fused to the surface of the coating and a small portion of the coating may be torn out. Both of these wear damage mechanisms are exacerbated by the presence of fine-scale surface roughness. The damage sites thus produced are usually quite small but can adversely affect the overall light transparency of the coated article. The accumulation of such damage over time may render the article unusable.

In an environment in which articles impact the surface of the transparent protective coating, it is important to minimize frictional forces between the impacting article and the coating. Fine-scale surface protrusions act to increase the coefficient of friction and may even fuse to the impacting article due to the extremely high point loading at the tips of the protrusions. In these cases small regions of the coating may be removed by the impacting article. Such damage regions, though small, have poor optical clarity, and serve to degrade the overall optical performance of the coated article.

Some workers have utilized a very thin (100 Å–1000 Å) low-friction overcoating to minimize frictional forces and impact damage. This technique will not, however, eliminate impact damage in the presence of fine-scale surface roughness.

Surface roughness is also important in a scratch damage environment, as when a sharp, pointed stylus is drawn across a coated surface. Here the roughness protrusions are discontinuities in the surface of the coating which act as damage initiation sites. Scratches often may initiate at these protrusions under conditions which do not produce a scratch in a smooth coating.

The surface roughness of transparent dielectric coatings is dependent upon initial substrate roughness, deposition process variables, and post-deposition processing. The surface of the uncoated substrate should be smooth in order to avoid replication of substrate roughness in the coating.

Deposition process parameters may strongly affect coating roughness as well. In physical vapor deposition processes such as thermal evaporation and sputtering, smooth coatings are promoted by low gas pressures and deposition angles close to the perpendicular. Higher deposition temperatures also tend to produce smoother coatings.

Even when the surface of the uncoated, starting substrate is polished to extreme smoothness, the surface of the coating will exhibit fine-scale surface roughness due to the growth kinetics of the coating. As the coating becomes thicker, this surface roughness will become more pronounced and more deleterious to the mechanical durability of the coating.

Final elimination of very fine-scale surface roughness is essential to produce the highly durable coatings for severe damage environments described by the invention. This can be accomplished by a post-deposition polishing operation which removes very fine-scale surface roughness to bring about an extraordinary improvement in the mechanical durability of the coatings.

Figure 2:
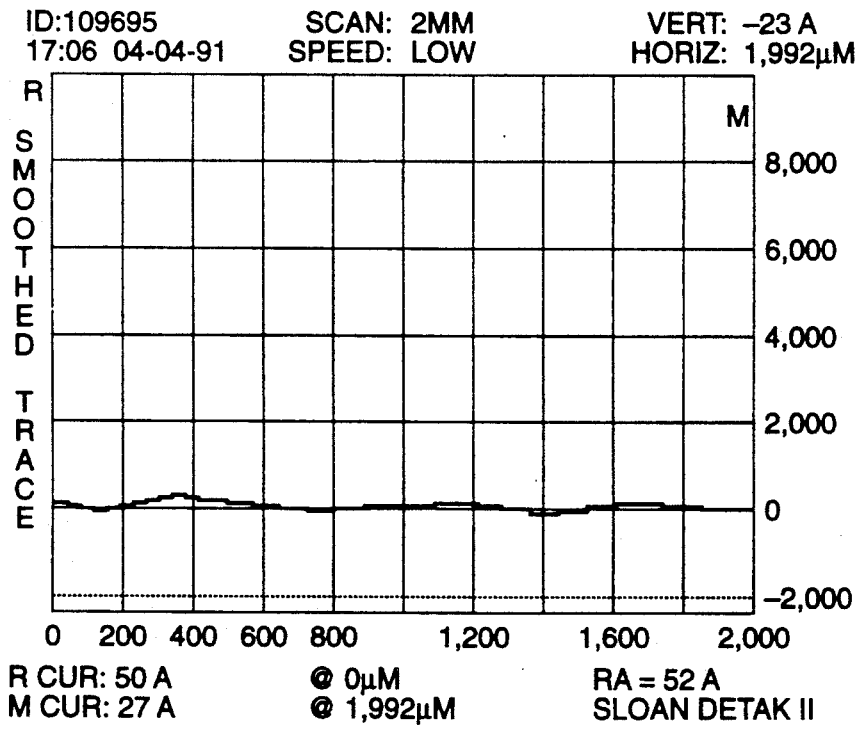

The effect of post-deposition polishing of coatings is shown by the surface profilometer traces of FIGS. 1 and 2. The surface profilometer is a device which measures surface roughness by passing a lightly loaded diamond stylus across a surface. The vertical movement of the stylus is then electronically transformed into a plot of the profile of the surface along the distance of travel of the stylus.

FIG. 1 is a profilometer trace of the surface of an unpolished aluminum nitride coating 3 microns in thickness. The coating was sputter deposited on a glass substrate. The figure is a plot of the height of surface roughness irregularities over a distance of 2 mm and is typical of the surface roughness commonly observed in transparent dielectric coatings of this thickness. The average rms surface roughness of this coating is 220 Å. FIG. 2 is a profilometer trace of the same coating after polishing for 20 minutes on a rotary polishing pad using a silica slurry as the polishing medium. Here the average rms surface roughness is 52 Å. It has been determined that surface roughness in excess of approximately 100 Å rms, will not produce the desired remarkable improvement in the mechanical durability of dielectric coatings.

It is not surprising that the surface of the coating becomes smooth after polishing, but it is surprising that there is such an extraordinary improvement in mechanical durability of these coatings after polishing.

As previously noted in practicing this invention multiple coating layers can be employed. A second substantially transparent layer can be coated over a first such layer to enhance wear resistance. Ideally, the top-coated transparent layer can provide a lower coefficient of friction, perhaps on the order of 0.2, than a previously coated transparent dielectric. As with the single layer embodiment, the additional layer(s) of transparent material, in combination, should exhibit an average surface roughness not exceeding 100 Å rms. As a preferred embodiment additional transparent layer(s) can be selected to enhance transmission of the transparent member without adversely reducing the wear resistance of the dielectric composite.

The second layer is intended to act as a lubricant to reduce the coefficient of friction of the composite. It is intended to be used in thicknesses from 100 to 1000 Å and must be a dielectric if its thickness would otherwise compromise transparency of the coating.

The following examples will show how the invention, in a surprisingly simple manner, produces a remarkable improvement in the mechanical durability of transparent dielectric coatings.

EXAMPLE 1

Effect of Post-Deposition Polishing on Wear Resistance of Transparent Dielectric Coatings The wear resistance of 0.5 to 10 micron thick transparent coatings of $Al_2O_3$, AlN, $Ta_2O_6$, and $Si_3N_4$, sputter coated on glass substrates was tested by repeated sliding contact with glass and metal objections such as cans and jars. A motor driven rotary carrier passed the metal cans and glass jars, each weighing approximately 1 pound, repeatedly across the coated surface of the glass substrate. The deposition conditions were varied to produce each of these coating materials in a range of as-coated surface roughnesses.

In the as-coated (unpolished) condition the surface roughness of these coatings was between approximately 100 Å average rms for the smoothest coatings to approximately 300 Å average rms for the roughest coatings. Wear testing of these coatings produced a rapid deterioration in the optical clarity of the coatings. For the roughest coatings, approximately 100,000 passes of the cans and jars across the coated surface produced significant scratching, streaking and marring of the surface of the coatings. For the smoothest coatings between 500,000 and 1,000,000 passes of the cans and jars were required to produce the same level of damage.

With post-deposition polishing for 20 minutes on a rotary polishing wheel using a silica slurry polishing medium to an average rms surface roughness of approximately 50 Å, identical coatings of these same materials survived 5–10 million passes of the cans and jars without significant degradation of their optical clarity. Very few scratches could be observed and there was no streaking of the coatings as was observed in the unpolished condition.

EXAMPLE 2

Effect of Post-Deposition Polishing on Impact Resistance of Transparent Dielectric Coatings The resistance of the transparent dielectric coatings of Example 1 to impact damage from metal cans and glass jars was tested by striking the cans and jars against the coated surface. In the as-coated (unpolished) condition the coatings show significant damage at the point of impact. Microscopic evaluation revealed that the damage consisted of regions of the coating that had been removed by the impacting article. The coating removal was especially severe with the impact of a glass jar on the unpolished coating surface. Coating removal was most severe in the roughest of the unpolished coatings, those with average surface roughness approximately 300 Å rms, but was observed in all of the coatings.

With post-deposition polishing as described in Example 1, to an average rms surface roughness of approximately 50 Å, identical coatings of these same materials showed no coating removal after impact testing. Surprisingly, it was the glass from the impacting jar which was removed and transferred to the polished surface of the coating. The transferred glass could be removed by scraping with a razor blade to reveal the undamaged surface of the coating. The transfer of glass during impact may be completely avoided by utilizing a thin (100 Å–1000 Å) substantially transparent, low-friction overcoat layer on top of the smooth dielectric coating preferably having a coefficient of friction below approximately 0.2.

EXAMPLE 3

Effect of Post-Deposition Polishing on Scratch Resistance of Transparent Dielectric Coatings The scratch resistance of the transparent dielectric coatings of Example 1 was evaluated using a scratch tester with a tungsten carbide scratching tool. In the scratch test the tungsten carbide scratching tool, mounted on a cantilevered arm, is passed across the coated surface. The downward force on the scratching tool may be changed by varying the position of a sliding weight on the cantilevered arm. The scratch resistance is measured by recording the load on the tungsten carbide tool at which the first scratch appears.

It was found that this scratch load threshold varied for coatings of different materials, but the smoother coating always had the highest scratch load threshold. For unpolished and polished coatings of a given material the difference in scratch load threshold is remarkable. As an example, unpolished, 3 micron thick sputter-deposited coatings of AlN with an average face roughness of approximately 200 Å typically have a scratch threshold of 200 grams using the tungsten carbide indenter. After polishing the coatings as described in Example 1, to an average rms surface roughness of 50 Å, the scratch threshold increases to 700 grams, indicating a significant increase in scratch resistance. Other coating materials show a similar improvement in scratch resistance after polishing.

In the foregoing examples the method used for polishing the coatings to remove surface roughness is not considered to be critical to the observed improvements in wear resistance, impact resistance, and scratch resistance. Post deposition polishing of coatings was carried out using a Strasbauch rotary polishing wheel with a medium nap polishing cloth. The polishing medium was a silica slurry in deionized water. Coated articles were polished for from 10 to 20 minutes at a polishing load that could be varied from approximately 0.2 to 0.5 lbs/in$^2$. Any of the various methods of polishing, well known to workers in the field, should produce the effects of remarkably improved wear resistance, impact resistance and scratch resistance as long as the surface roughness protrusions are removed so that the polished surface has an average rms surface roughness not exceeding 100 Å.

I claim:

1. A substantially transparent wear resistant member comprising a substantially transparent support having a layer of a substantially transparent dielectric coated thereon wherein said dielectric layer exhibits an average surface roughness not exceeding 100 Å rms.

2. The member of claim 1 wherein said substantially transparent support comprises a substantially planar piece of glass.

3. The member of claim 1 wherein said substantially transparent dielectric layer comprises a member selected from the group consisting of $Al_2O_3$, AlN, $Ta_2O_5$ and $Si_3N_4$.

4. The member of claim 1 wherein said dielectric is applied to said support by a method selected from the group consisting of evaporation, sputtering, chemical vapor deposition and dip coating and then polished to exhibit said average surface roughness not exceeding 100 Å rms.

5. The member of claim 1 wherein said dielectric is overcoated with a second substantially transparent layer wherein said second layer enhances the wear resistance of said dielectric layer.

6. The member of claim 5 wherein said combination of substantially transparent layers exhibit an average surface roughness not exceeding 100 Å rms.

7. The member of claim 5 wherein said second substantially transparent layer comprises a member selected to provide a lower coefficient of friction than the first substantially transparent dielectric layer.

8. The member of claim 5 wherein said second substantially transparent layer comprises a member selected from the group consisting of magnesium fluoride, tin oxide, antimony oxide and indium oxide.

9. The member of claim 7 wherein said second substantially transparent layer comprises a member selected to provide a coefficient of friction below 0.2.

10. The member of claim 1 wherein said dielectric is overcoated with one or more substantially transparent dielectric layers characterized as having a lower coefficient to friction than said dielectric wherein said additional dielectric layers are selected to enhance the wear resistance of said dielectric layer.

11. The member of claim 10 wherein said combination of substantially transparent dielectric layers exhibit an average surface roughness not exceeding 100 Å rms.

* * * * *